United States Patent
Huang et al.

(10) Patent No.: US 10,555,420 B1
(45) Date of Patent: Feb. 4, 2020

(54) CIRCUIT BOARD AND METHOD FOR MANUFACTURING THE SAME

(71) Applicants: HongQiSheng Precision Electronics (QinHuangDao) Co., Ltd., Qinhuangdao (CN); Avary Holding (Shenzhen) Co., Limited., Shenzhen (CN)

(72) Inventors: Han-Pei Huang, New Taipei (TW); Yong-Quan Yang, Qinhuangdao (CN)

(73) Assignees: HongQiSheng Precision Electronics (QinHuangDao) Co., Ltd., Qinhuangdao (CN); Avary Holding (Shenzhen) Co., Limited., Shenzhen (CN)

( * ) Notice: Subject to any disclaimer, the term of this patent is extended or adjusted under 35 U.S.C. 154(b) by 0 days.

(21) Appl. No.: 16/145,238

(22) Filed: Sep. 28, 2018

(30) Foreign Application Priority Data

Aug. 1, 2018 (CN) .......................... 2018 1 0860025

(51) Int. Cl.
| | |
|---|---|
| H05K 1/02 | (2006.01) |
| H05K 1/18 | (2006.01) |
| H05K 1/03 | (2006.01) |
| H05K 1/11 | (2006.01) |
| H05K 3/24 | (2006.01) |
| H05K 1/05 | (2006.01) |
| H05K 3/32 | (2006.01) |
| H05K 1/09 | (2006.01) |

(52) U.S. Cl.
CPC .......... H05K 1/186 (2013.01); H05K 1/0298 (2013.01); H05K 1/0393 (2013.01); H05K 1/05 (2013.01); H05K 1/09 (2013.01); H05K 1/115 (2013.01); H05K 3/241 (2013.01); H05K 3/321 (2013.01)

(58) Field of Classification Search
CPC .... H05K 1/186; H05K 1/0298; H05K 1/0393; H05K 1/05; H05K 1/09; H05K 1/115
USPC .......................................................... 174/250
See application file for complete search history.

(56) References Cited

U.S. PATENT DOCUMENTS

2014/0070394 A1* 3/2014 Moriya ............... H01L 23/3735
257/690

\* cited by examiner

*Primary Examiner* — Tremesha S Willis
(74) *Attorney, Agent, or Firm* — ScienBiziP, P.C.

(57) ABSTRACT

A method of manufacturing a circuit board includes: a single-sided copper-clad base is provided; a plurality of grooves are defined in the base facing away from the copper-clad side for receiving electronic elements, a depth of each of the grooves is equal to a thickness of the corresponding electronic element; the electronic elements are fixed into their respective grooves; a plurality of holes are defined in the laminating member to expose the electrodes of the electronic elements; an electroplated layer is formed on the surface of the embedded body, the electroplated layer is electrically connected with the electrodes of the electronic elements. A circuit board made by the method is also provided.

17 Claims, 5 Drawing Sheets

CIRCUIT BOARD AND METHOD FOR MANUFACTURING THE SAME

FIELD

The subject matter herein generally relates to a circuit board and method for manufacturing the circuit board.

BACKGROUND

Electronic elements (such as resistance, capacitance, and so on) of a flexible printed circuit board are embedded into the flexible printed circuit board, so that a thickness of the flexible printed circuit board is reduced, as well as reducing a thickness of an electronic product having the flexible printed circuit board.

In traditional manufacturing processes, a multilayer circuit board is provided with open holes defined therein, and the electronic elements are received in the open-holes. However, due to the difference in height of different electronic elements, it is difficult to ensure that pads of the electronic elements have the same height to a copper layer on the surface of the embedded substrate, thereby causing different depths of the holes to be opened when the electronic elements are connected. In the production process, the processing depth of each hole is different, which greatly affects the working efficiency, and affects connection effect between the electronic elements and the circuit pattern.

Therefore, there is room for improvement within the art.

BRIEF DESCRIPTION OF THE DRAWINGS

Implementations of the present technology will now be described, by way of only, with reference to the attached figures.

DETAILED DESCRIPTION

Figure 1:
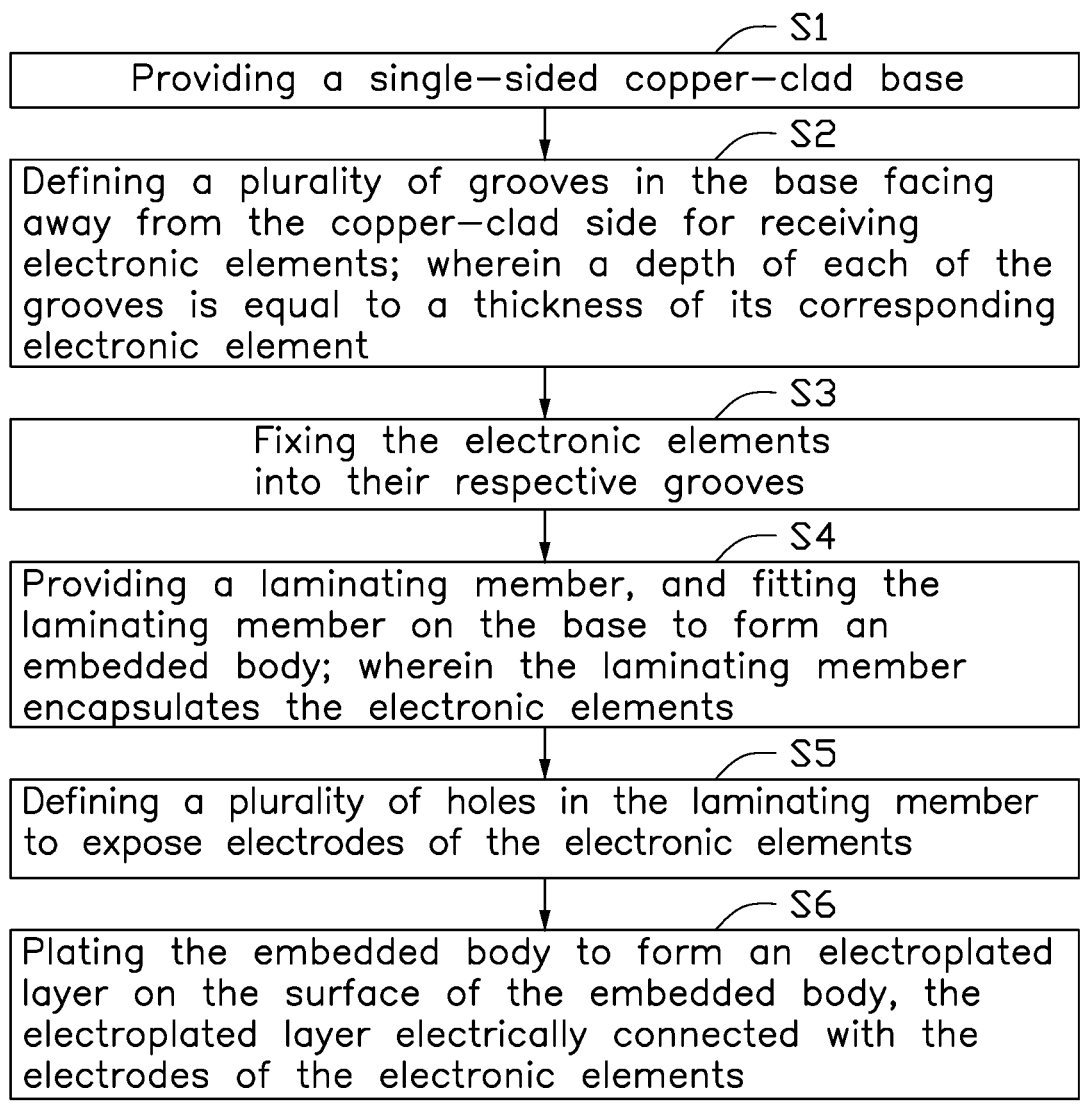
FIG. 1 is a flowchart of a method for manufacturing an embedded substrate according to an embodiment.

It will be appreciated that for simplicity and clarity of illustration, where appropriate, reference numerals have been repeated among the different figures to indicate corresponding or analogous elements. In addition, numerous specific details are set forth in order to provide a thorough understanding of the embodiments described herein. However, it will be understood by those of ordinary skill in the art that the embodiments described herein can be practiced without these specific details. In other instances, methods, procedures, and components have not been described in detail so as not to obscure the related relevant feature being described. Also, the description is not to be considered as limiting the scope of the embodiments described herein. The drawings are not necessarily to scale and the proportions of certain parts may be exaggerated to better illustrate details and features of the present disclosure.

The term "comprising," when utilized, means "including, but not necessarily limited to"; it specifically indicates open-ended inclusion or membership in the so-described combination, group, series and the like.

FIG. 1 shows a flowchart for a method of manufacturing an embedded substrate 100, which can be regarded as a circuit board, in accordance with an embodiment. The method is provided by way of example, as there are a variety of ways to carry out the method. The method described below can be carried out using the configurations shown in FIGS. 2-9, for example, and various elements of these figures are referenced in explaining the method. Each block shown in FIG. 1 represents one or more processes, methods, or subroutines, carried out in the method. Furthermore, the shown order of blocks is illustrative only and the order of the blocks can change. Additional blocks can be added or fewer blocks may be utilized, without departing from this disclosure. The example method can begin at block 51.

Figure 2:
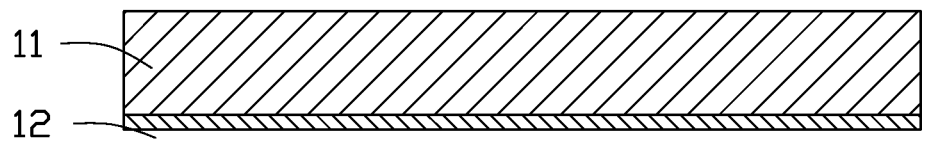
FIG. 2 shows a cross sectional view of a base used in the method of manufacturing the embedded substrate of FIG. 1.

At block 51, as shown in FIG. 2, a single-sided copper-clad base 10 is provided.

The base 10 includes a basic layer 11 and a first copper layer 12 formed on the basic layer 11. A thickness of the first copper layer 12 is selected according to the copper thickness specification of the line process. Typically, the thickness of the first copper layer 12 is less than or equal to 3 µm.

The basic layer 11 is made of, but not limited to, polyimide (PI), liquid crystal polymer (LCP), polyethylene terephthalate (PET), or Polyethylene Naphthalate (PEN).

Figure 3:
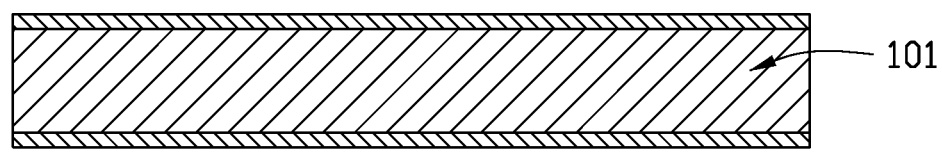
FIG. 3 shows a cross sectional view for manufacturing the base in FIG. 2.
Figure 3:
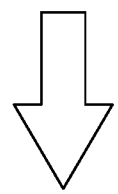
Figure 3:
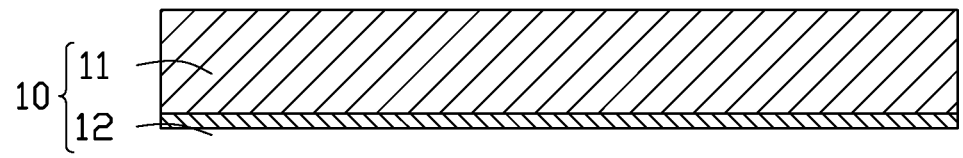

As shown in FIG. 3, a fabrication of the base 10 includes: providing a double-sided copper laminate 101, and performing single-sided copper etching on the double-sided copper laminate 101 to obtain the base 10. During processing, when one side of the double-sided copper laminate 101 is completely copper-etched, the other side may be subjected to copper reduction treatment to meet the copper thickness requirement of subsequent fine wiring.

Alternatively, the fabrication of the base 10 may include: providing the basic layer 11, and forming the first copper layer 12 on the basic layer 11. The first copper layer 12 may be plated on the basic layer 11.

Figure 4:
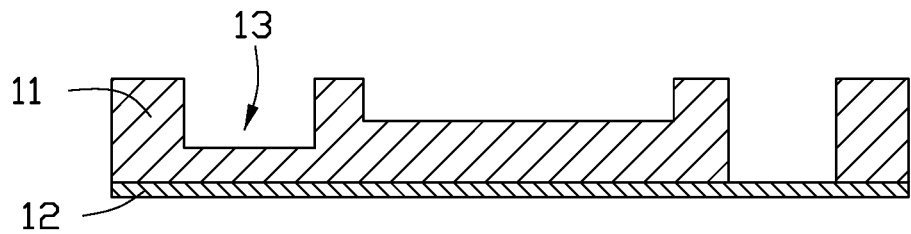
FIG. 4 shows a cross sectional view of the base in FIG. 2, after defining grooves.

At block S2, as shown in FIG. 4, a plurality of grooves 13 are defined in the base 10 facing away from the copper-clad side for receiving electronic elements 20, a depth of each of the grooves 13 being equal to a thickness of the corresponding electronic element 20.

The grooves 13 are defined in the basic layer 11, and are opposite from the first copper layer 12. Since the electronic elements 20 have different thickness, the depths of the grooves 13 are also different. The groove 13 may be a cavity (not penetrating the basic layer 11) or an opening (penetrating through the basic layer 11) depending on the depth.

Specifically, a plurality of optical positioning points are formed on a surface of the basic layer 11 facing away from the first copper layer 12 according to the electronic elements 20 that needs to be embedded. The grooves 13 are defined at the optical positioning points at predetermined depths according to the thicknesses of their respective electronic elements 20.

In this embodiment, top surfaces of the electrodes of each electronic element 20 together form a top surface of the electronic element 20. The electrodes of each electronic element 20 have uniform heights. Top surfaces of the electronic elements 20 are made flush with a surface of the basic layer 11 when the electronic elements 20 are received in the grooves 13.

Figure 5:
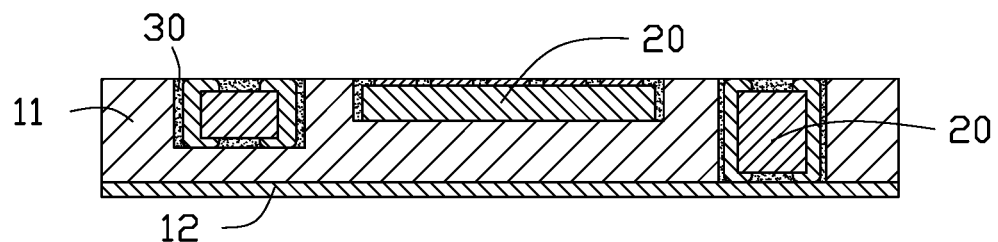
FIG. 5 shows a cross sectional view of the base in FIG. 4, after embedding electronic elements.

At block S3, as shown in FIG. 5, the electronic elements 20 are fixed into their respective grooves 13.

In this embodiment, the electronic elements 20 are fixed into the grooves 13 using glue 30. Specifically, the electronic elements 20 are placed in their respective grooves 13, and the glue 30 is injected into the grooves 13 until a top surface of the glue 30 is flush with the surface of the basic layer 11. The glue 30 is then cured.

The glue 30 is insulated and is a viscous resin. The glue 30 may be at least one of Polypropylene, epoxy, polyurethane, phenolic, urea-formaldehyde, melamine-ormaldehyde and polyimide.

In other embodiments, the electronic elements 20 can also be fixed in the grooves 13 by other processes or materials, as long as the performances of the electronic elements 20 are not affected.

Figure 6:
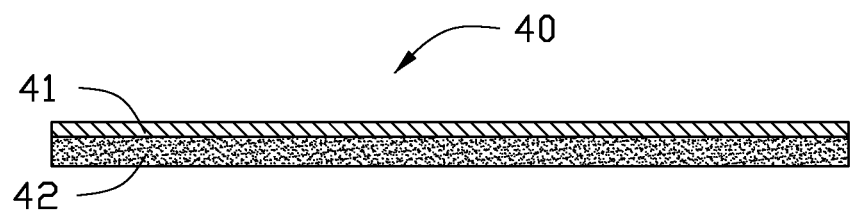
FIG. 6 shows a cross sectional view of a laminating member used in the method of manufacturing the embedded substrate of FIG. 1.
Figure 7:
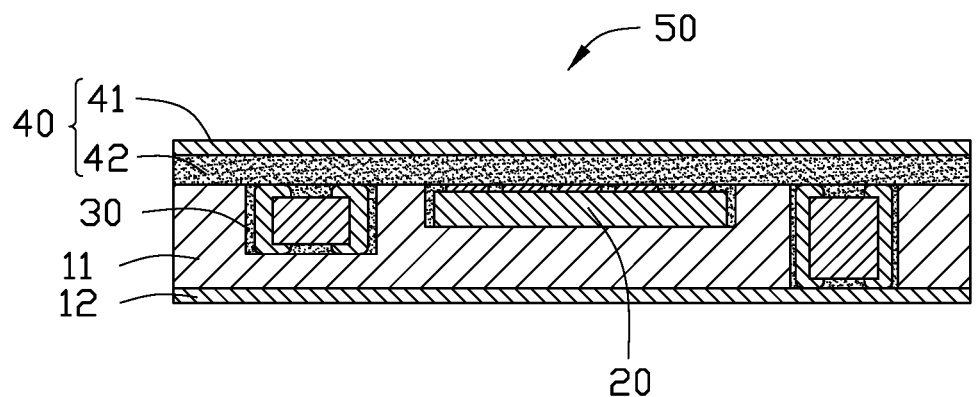
FIG. 7 shows a cross sectional view of the base in FIG. 5 and the laminating member in FIG. 6 after fitting the laminating member on the base.

At block S4, as shown in FIG. 6 and FIG. 7, a laminating member 40 is fit on the base 10 to form an embedded body 50, the laminating member 40 encapsulates the electronic elements 20.

The laminating member 40 may include a second copper layer 41 and an insulation layer 42. The insulation layer 42 is made of a viscous resin. The second copper layer 41 is fit on the basic layer 11 through the insulation layer 42 to form the embedded body 50. The viscous resin of the insulation layer 42 may be at least one of Polypropylene, epoxy, polyurethane, phenolic, urea-formaldehyde, melamine-ormaldehyde and polyimide. In this embodiment, the viscous resin of the insulation layer 42 is the same with that of the glue 30.

Figure 8:
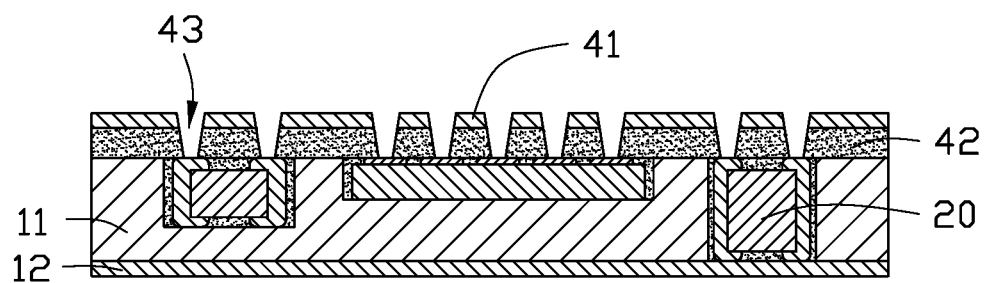
FIG. 8 shows a cross sectional view of the structure in FIG. 7, after defining holes on the laminating member.

At block S5, as shown in FIG. 8, a plurality of holes 43 are defined in the laminating member 40 to expose the electrodes of the electronic elements 20.

The holes 43 are formed by laser. Each of the holes 43 penetrates through the second copper layer 41 and the insulation layer 42 to expose the electrodes of the electronic elements 20.

Figure 9:
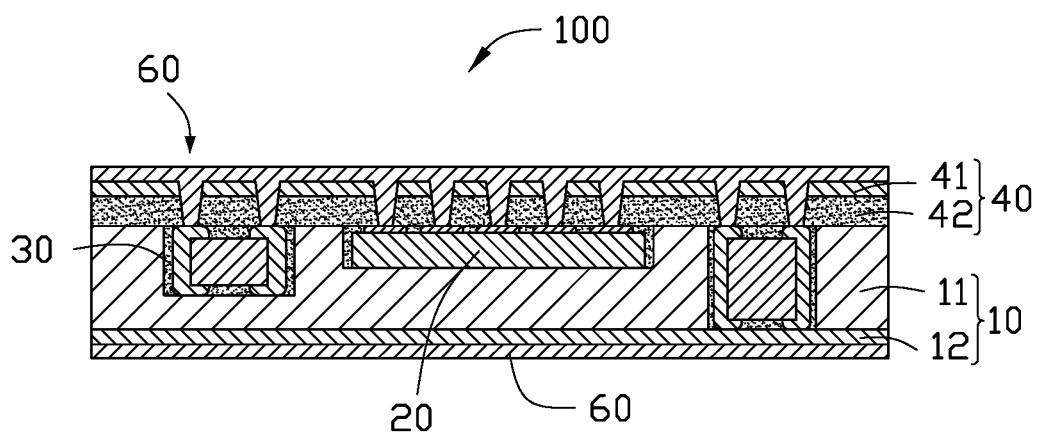
FIG. 9 shows a cross sectional view of the embedded substrate manufactured by the method in FIG. 1.

At block S6, as shown in FIG. 9, an electroplated layer 60 is integrally formed on the surface of the embedded body 50, the electroplated layer 60 electrically connects the with the electrodes of the electronic elements 20.

Outside surfaces of the embedded body 50 are completely plated. The electroplated layer 60 coats the embedded body 50 and fills the holes 43 to electrically connect with the electrodes of the electronic elements 20.

At this point, the embedded substrate 100 is completed. The embedded substrate 100 of the present disclosure is suitable for use with circuit boards 200 of different functions. When the circuit board 200 is subsequently formed, it is only necessary to perform line formation on the electroplated layer 60 of the embedded substrate 100 according to actual needs.

The specific circuit fabrication includes: etching the electroplated layer 60 to form an electroplated circuit pattern 601, and forming or mounting a circuit substrate 70 on the electroplated circuit pattern 601.

Figure 10:
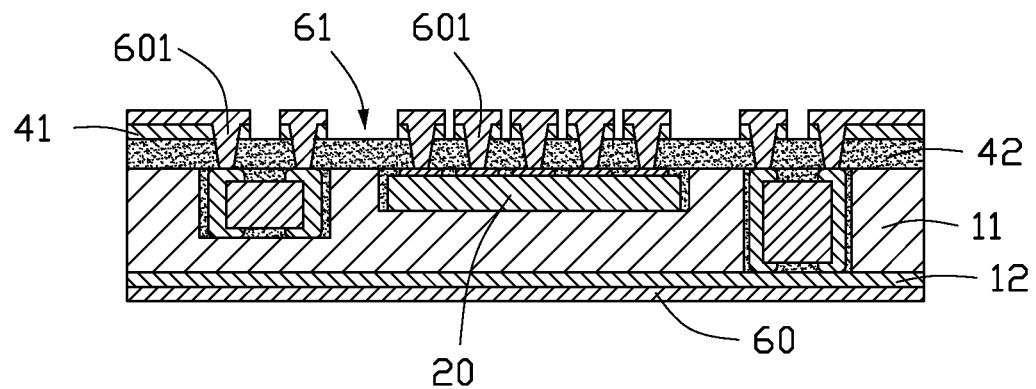
FIG. 10 shows a cross sectional view of the embedded substrate in FIG. 9, after partially etching an electroplated layer.
Figure 11:
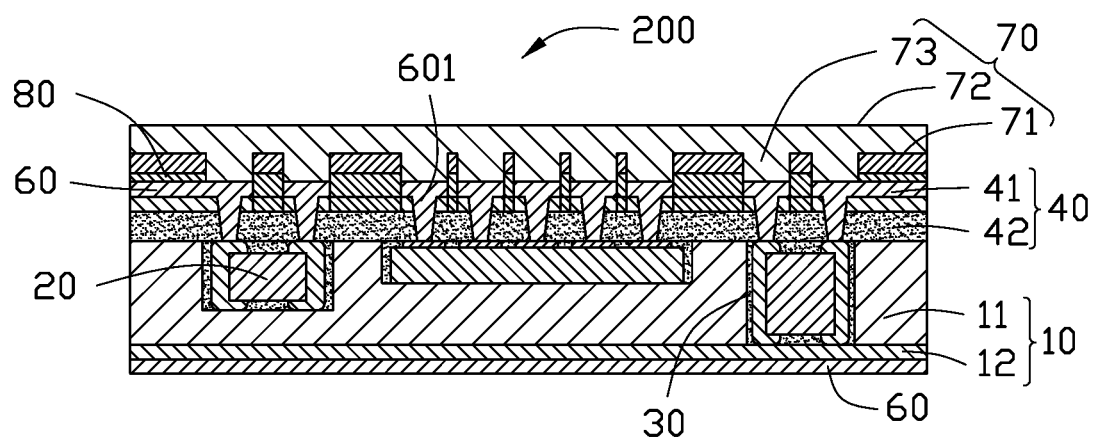
FIG. 11 shows a cross sectional view of the embedded substrate in FIG. 10, after forming a circuit substrate on the electroplated layer.

The circuit substrate 70 is just as shown in FIGS. 10 and 11. Of course, FIG. 10 and FIG. 11 are only schematic diagrams of one of the circuit boards 200. In other embodiments, the subsequently-produced lines may also include double-layer or multi-layer lines, etc., which are not described herein.

FIG. 9 shows the embedded substrate 100 including a single-sided copper-clad base 10, a laminating member 40, and an electroplated layer 60. A plurality of grooves 13 are defined in the base 10 facing away from the copper-clad side for embedding electronic elements 20. A depth of each of the grooves 13 is equal to a thickness of its corresponding electronic element 20. The laminating member 40 is fit on the base 10 for encapsulating the electronic elements 20. A plurality of holes 43 are defined in the laminating member 40 to expose electrodes of the electronic elements 20. The electroplated layer 60 coats the base 10 and the laminating member 40, and fills the holes 43 to electronically connect the electrodes of the electronic elements 20.

The base 10 includes a basic layer 11 and a first copper layer 12 formed on the basic layer 11.

The basic layer 11 is made of, but not limited to, polyimide (PI), liquid crystal polymer (LCP), polyethylene terephthalate (PET), or Polyethylene Naphthalate (PEN).

A thickness of the first copper layer 12 is selected according to the copper thickness specification of the line process. Typically, the thickness of the first copper layer 12 is less than or equal to 3 μm.

The grooves 13 are defined in the basic layer 11, and are opposite from the first copper layer 12. The electronic elements 20 are fixed into the grooves 13 using glue 30. Top surfaces of the electrodes of the electronic elements 20 are made flush with the surface of the basic layer 11.

Since the electronic elements 20 have different thickness, the depths of the grooves 13 are also different. The groove 13 may be a cavity (not penetrating the basic layer 11) or an opening (penetrating through the basic layer 11) depending on their depth.

The glue 30 is insulated and is a viscous resin. The glue 30 may be at least one of Polypropylene, epoxy, polyurethane, phenolic, urea-formaldehyde, melamine-ormaldehyde and polyimide.

The laminating member 40 includes a second copper layer 41 and an insulation layer 42. The insulation layer 42 is made of a viscous resin. The second copper layer 41 is fitting on the basic layer 11 through the insulation layer 42. The viscous resin of the insulation layer 42 may be at least one of Polypropylene, epoxy, polyurethane, phenolic, ureaformaldehyde, melamine-ormaldehyde and polyimide. In this embodiment, the viscous resin of the insulation layer 42 is the same with that of the glue 30.

The holes 43 are formed by laser. Each of the holes 43 penetrates through the second copper layer 41 and the insulation layer 42 to expose the electrodes of the electronic elements 20.

Referring to FIG. 11, the circuit board 200 of the present disclosure is an embedded flexible circuit board. The circuit board 200 includes the embedded substrate 100 and a circuit substrate 70 fit on the electroplated layer 60 of the embedded substrate 100.

In this embodiment, the electroplated layer 60 is etched to form an electroplated circuit pattern 601. A plurality of gaps 61 are defined in the electroplated layer 60 by etching. Each of the gaps 61 passes through the electroplated layer 60 and the second copper layer 41.

The circuit substrate 70 is fit on the electroplated circuit pattern 601. In this embodiment, the circuit substrate 70 is a single-sided wiring board. The circuit substrate 70 includes an insulating layer 71 and a pattern layer 72 formed on the insulating layer 71. The insulating layer 71 is fit on the electroplated circuit pattern 601 using an adhesive layer 80, and the adhesive layer 80 fills the gaps 61. The circuit substrate 70 further includes a plurality of conductive structures 73. The pattern layer 72 is electrically connected to the electroplated circuit pattern 601 through the conductive structures 73.

The adhesive layer 80 is insulated and is made of a viscous resin. The viscous resin of the adhesive layer 80 may be at least one of Polypropylene, epoxy, polyurethane, phenolic, urea-formaldehyde, melamine-ormaldehyde and polyimide. In this embodiment, the viscous resin of the adhesive layer 80 is the same with that of the glue 30.

In other embodiments, the circuit substrate 70 can be a double-sided circuit substrate or a multilayer circuit substrate. In other embodiments, a single-layer circuit, a double-layer circuit, or a multilayer circuit may be fabricated on the electroplated layer 60 which on the first copper layer 12.

The embodiments shown and described above are only examples. Many details are often found in the art. Therefore, many such details are neither shown nor described. Even though numerous characteristics and advantages of the present technology have been set forth in the foregoing description, together with details of the structure and function of the present disclosure, the disclosure is illustrative only, and changes may be made in the details, including in matters of shape, size, and arrangement of the parts within the principles of the present disclosure, up to and including the full extent established by the broad general meaning of the terms used in the claims. It will therefore be appreciated that the embodiments described above may be modified within the scope of the claims.

What is claimed is:

1. A method of manufacturing a circuit board, comprising:
   providing a single-sided copper-clad base;
   defining a plurality of grooves in the base facing away from the copper-clad side for receiving electronic elements; wherein a depth of each of the grooves is equal to a thickness of its corresponding electronic element;
   fixing the electronic elements into their respective grooves;
   providing a laminating member, and fitting the laminating member on the base to form an embedded body; wherein the laminating member encapsulates the electronic elements;
   defining a plurality of holes in the laminating member to expose electrodes of the electronic elements; and
   plating the embedded body to form an electroplated layer on the surface of the embedded body, the electroplated layer electrically connected with the electrodes of the electronic elements;
   wherein top surfaces of the electrodes of each electronic element together form a top surface of the electronic element, the electrodes of each electronic element have uniform heights, top surfaces of the electronic elements are made flush with a surface of the base when the electronic elements are received in the grooves.

2. The method of manufacturing the circuit board of claim 1, further comprising etching the electroplated layer to form an electroplated circuit pattern, and forming or mounting a circuit substrate on the electroplated circuit pattern.

3. The method of manufacturing the circuit board of claim 1, wherein the base comprises a basic layer and a first copper layer formed on the basic layer.

4. The method of manufacturing the circuit board of claim 3, wherein the base is fabricated by: providing a double-sided copper laminate, and performing single-sided copper etching on the double-sided copper laminate.

5. The method of manufacturing the circuit board of claim 3, wherein the grooves are defined in the basic layer, and face away from the first copper layer.

6. The method of manufacturing the circuit board of claim 5, wherein the laminating member comprises a second copper layer and an insulation layer; the second copper layer is fit on the basic layer through the insulation layer, which encapsulates the electronic elements.

7. The method of manufacturing the circuit board of claim 1, wherein the holes are formed by laser.

8. A circuit board, comprising:
   a single-sided copper-clad base, a plurality of grooves defined in on a surface of the base facing away from a copper-clad side of the base for receiving electronic elements;
   a laminating member fit on the base for encapsulating the electronic elements, a plurality of holes defined in the laminating member to expose electrodes of the electronic elements; and
   an electroplated layer forming onto the base and the laminating member, and filling the holes to electronically connect with the electrodes of the electronic elements;
   wherein a depth of each of the grooves is equal to a thickness of its corresponding electronic element; and
   wherein top surfaces of the electrodes of each electronic element together form a top surface of the electronic element, the electrodes of each electronic element have uniform heights, top surfaces of the electronic elements are made flush with a surface of the base when the electronic elements are received in the grooves.

9. The circuit board of claim 8, wherein the base comprises a basic layer and a first copper layer formed on the basic layer, the grooves are defined in the basic layer, and face away from the first copper layer.

10. The circuit board of claim 9, wherein the laminating member comprises a second copper layer and an insulation layer; the second copper layer is fit on the basic layer through the insulation layer, which encapsulates the electronic elements.

11. The circuit board of claim 8, wherein the holes are formed by laser.

12. A circuit board, comprising:
   a single-sided copper-clad base, a plurality of grooves defined in the base facing away from a copper-clad side of the base for receiving electronic elements;
   a laminating member fit on the base for encapsulating the electronic elements, a plurality of holes defined in the laminating member to expose electrodes of the electronic elements;
   an electroplated circuit pattern formed on the laminating member, the electroplated circuit pattern electronically connecting with the electrodes of the electronic elements; and
   a circuit substrate fit on the electroplated circuit pattern and electronically connecting with the electroplated circuit pattern;
   wherein a depth of each of the grooves is equal to a thickness of its corresponding electronic element; and
   wherein top surfaces of the electrodes of each electronic element together form a top surface of the electronic element, the electrodes of each electronic element have uniform heights, top surfaces of the electronic elements are made flush with a surface of the base when the electronic elements are received in the grooves.

13. The circuit board of claim 12, wherein the base comprises a basic layer and a first copper layer formed on the basic layer, the grooves are defined in the basic layer, and face away from the first copper layer.

14. The circuit board of claim 13, wherein the laminating member comprises a second copper layer and an insulation layer; the second copper layer is fit on the basic layer through the insulation layer, which encapsulates the electronic elements.

15. The circuit board of claim 12, wherein the holes are formed by laser.

16. The circuit board of claim 12, wherein the circuit substrate comprises an insulating layer and a pattern layer formed on the insulating layer, the insulating layer is fit on the electroplated circuit pattern using an adhesive layer.

17. The circuit board of claim 16, wherein the circuit substrate further comprises a plurality of conductive structures, the pattern layer is electrically connected to the electroplated circuit pattern through the conductive structures.

\* \* \* \* \*